United States Patent [19]
Hall et al.

[11] 3,743,894
[45] July 3, 1973

[54] ELECTROMIGRATION RESISTANT SEMICONDUCTOR CONTACTS AND THE METHOD OF PRODUCING SAME

[75] Inventors: Edward L. Hall; Elliott M. Philofsky, both of Phoenix, Ariz.

[73] Assignee: Motorola, Inc., Frankling Park, Ill.

[22] Filed: June 1, 1972

[21] Appl. No.: 258,620

[52] U.S. Cl........ 317/234 R, 317/234 J, 317/234 N, 204/15
[51] Int. Cl............................. H01l 3/00, H01l 5/00
[58] Field of Search......................... 317/234, 5, 5.4; 204/15

[56] References Cited

UNITED STATES PATENTS 3,634,203 1/1972 McMahon............................ 304/15

OTHER PUBLICATIONS

IBM Technical Disclosure Bulletin, By Biyal et al.; Vol. 13 No. 6 Nov. 70 page 1729
IBM Technical Disclosure Bulletin; By Heurle et al.; Vol. 13 No. 6. Nov. 1970.
IBM Technical Disclosure Bulletin; by Horstmann; Vol. 13 No. 7 Dec. 1970.

*Primary Examiner*—John W. Huckert
*Assistant Examiner*—Andrew J. James
*Attorney*—Vincent J. Rauner et al.

[57] ABSTRACT

A technique of reducing the susceptibility of aluminum semiconductor contacts to electromigration. Aluminum contacts containing a small percentage of copper therein are formed on a semiconductor device by evaporation techniques. Subsequently the device is heated to a temperature of greater than 400° to alloy the copper into the aluminum and quickly cooled to form copper rich precipitates between the grains of aluminum along the grain boundaries and triple points thereof for the purpose of reducing electromigration along grain boundaries.

4 Claims, 2 Drawing Figures

ELECTROMIGRATION RESISTANT SEMICONDUCTOR CONTACTS AND THE METHOD OF PRODUCING SAME

BACKGROUND FIELD OF INVENTION

This invention relates generally to methods and means for making ohmic contacts to semiconductor devices, and more particularly to evaporative co-deposition and heat treating of an aluminum and copper alloy to form an electromigration resistant semiconductor contact.

In the fabrication of semiconductor devices, a contact metal layer of aluminum is generally used to make ohmic contact to the device. When the device is operated under high current and high temperature conditions, the aluminum contact metal is transported by the current flowing therethrough causing the metal to build up in some areas and to form voids in others. The voids can become large enough to sufficiently increase the resistance of the metal contact in the area where the voids occur to allow resistive heating to cause the contact metal to melt, thereby causing premature failure of the device.

PRIOR ART

Several techniques for reducing electromigration are known. In one such system, alternate layers of aluminum and copper are deposited to form the contact. Subsequent to deposition, the device is heated to alloy the copper into the aluminum and slowly cooled to form copper rich precipitates within the contact metal. Whereas this technique provides a way to reduce electromigration, the deposition process is relatively complex and electromigration still occurs to a significant extent.

SUMMARY

It is an object of the present invention to provide a method for obtaining an improved electromigration resistant ohmic contact for a semiconductor device.

It is another object of this invention to provide an electromigration resistant contact for a semiconductor device that can be readily produced through the use of standard semiconductor processing steps.

Yet another object of this invention is to provide a more reliable semiconductor device.

In accordance with a preferred embodiment of the invention, aluminum contact metalization is co-deposited with a small percentage of copper on the order of 1 to 10 percent by weight, preferably 2 percent. The deposition may be achieved by a vapor deposition process wherein the aluminum and copper are simultaneously evaporated onto the semiconductor substrate from separate sources, or from an aluminum-copper alloy source. Subsequent to deposition, the entire device including the metal contacts is heated to a temperature of at least 400°C to cause the copper to go into solution with the aluminum. The device is then rapidly cooled at a rate of at least 50°C per second to form a fine grain structure of $CuAl_2$ grains having a diameter of less than 1,000 Angstroms interspersed between aluminum grains at the grain boundaries and triple points thereof. In this application, grain boundaries are defined as the boundaries formed by adjacent aluminum grains, and triple points are defined as the points of contact between three or more grains of aluminum. The metal layer may then be covered with a passivation glass such as silicon dioxide or silicon nitride to further reduce electromigration along the surface of the metal contact.

DETAILED DESCRIPTION

Figure 1:
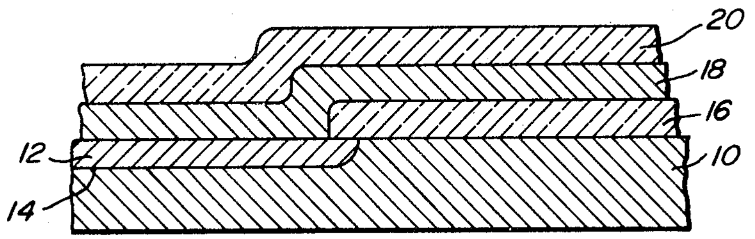
FIG. 1 is a cross-sectional view of a semiconductor device employing the improved contact metal according to the invention.

Referring to FIG. 1, there is shown a cross-sectional view of a portion of a semiconductor device having an ohmic contact made thereto. A semiconductor substrate 10 has an area of impurities 12 diffused therein. The diffused area 12 and substrate 10 form a junction at a line 14. Although a single area of impurities which is diffused directly into the substrate to form a single junction is shown, the diffusion can be made into other areas, such as, for example, epitaxial layers or into other diffusions to form a multiplicity of junctions. An insulating layer 16 of material, such as, for example, silicon dioxide or silicon nitride is deposited according to techniques well known in the art over a predetermined portion of the substrate, leaving exposed the portion of the diffused area to which contact is to be made.

A layer of metalization 18 comprising aluminum and a small percentage of copper is deposited over the entire substrate including the exposed contact area. The relative amount of copper in the metal layer is in the range of 1 percent to 10 percent by weight and preferably in the range of 2 to 4 percent. The deposition is achieved through the use of standard vapor deposition techniques in which an aluminum-copper alloy is heated to a temperature on the order of 1,000° to 1,200°C to cause vaporization of the aluminum. The substrate is placed in an evacuated evaporation chamber and the evaporating metal is deposited onto the substrate. Subsequent to deposition, the aluminum is masked and etched to a desired predetermined pattern and alloyed into the contact area to form an ohmic contact according to practices well known in the semiconductor art. A second glass insulating layer 20 such as, for example, silicon dioxide or silicon nitride may be deposited over the device, including the metal layer 18, to provide passivation and to reduce electromigration along the surface of the metal.

In order to render the metal layer 18 relatively resistant to electromigration, the device including the metal layer must be heat treated in a particular fashion. The heat treating method, according to the invention, for rendering the metal layer 18 resistant to electromigration includes the steps of heating the device to a temperature of at least 400°C, preferably in the range of 425° to 475° C for a time duration sufficient to cause the copper to dissolve into the aluminum. After the copper has dissolved into the aluminum, the device is rapidly cooled, or quenched, at a rapid rate, preferably at the rate of at least 50° to 100°C per second. The quenching process causes grains of aluminum rich precipitate in the form of $CuAl_2$ to form along the grain boundaries of the aluminum. The rapid quenching produces a fine grain structure wherein the grains of copper rich precipitate are less than 1,000 Angstroms in diameter, generally on the order of 700 Angstroms. The formation of the fine grain structure provides improved electromigration resistance over prior art methods employing copper precipitates wherein the device is slowly cooled following heat treatment. In the prior art systems, the grains of copper rich precipitate are of a larger diameter than the grains formed by the technique of the present invention and are generally on the order of more than 2,500 Angstroms.

Figure 2:
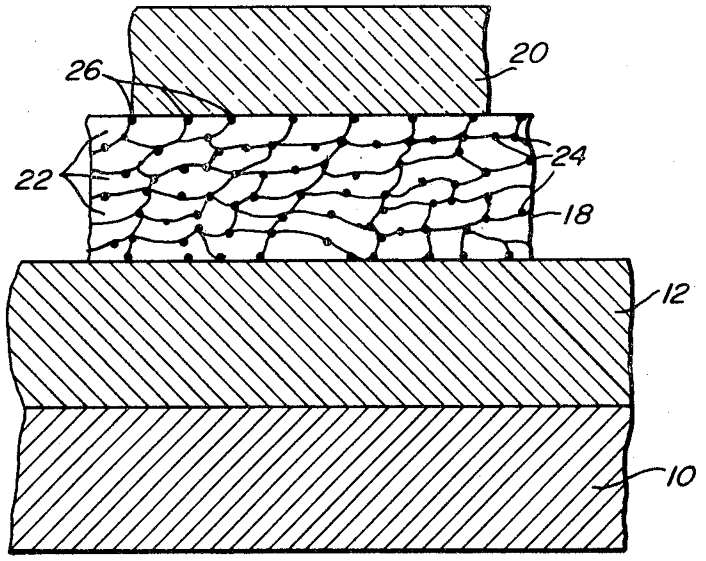
FIG. 2 is a highly magnified cross-sectional view of a portion of the semiconductor device showing the positioning of the grains of copper rich precipitate along the grain boundaries and triple points of the aluminum grains.

Referring to FIG. 2, there is shown a greatly magnified view of a portion of a semiconductor showing the grain structure of the metal layer 18. FIG. 2 is included to illustrate the mechanism by which it is believed that the fine grains of copper rich precipitate reduce electromigration. FIG. 2 is a magnified version of a portion of FIG. 1 and includes a portion of substrate 10, impurity area 12, the portion of the metal layer 18 overlying impurity area 12 and a portion of the glass layer 20. FIG. 2 shows the structure of the metal layer obtained by the process of the present invention. After the device has been heated to cause the copper to go into solution with the aluminum, the rapid cooling process causes grains of copper rich precipitate to form between grains of aluminum. The aluminum grains are indicated by the light areas 22 and the grains of copper rich precipitate are indicated by the dark areas 24 and 26. Note that there are two distinct sizes of grains of copper rich precipitate, those in the interior of the metal 24 which are relatively small (700 Angstroms), and those on the surface 26 which are relatively large (2,500 Angstroms).

Extensive experimentation with the phenomenon of electromigration indicates that when heavy currents are passed through metal layers at elevated temperatures on the order of more than 125°C, the flow of current causes atoms of metal to shift. In aluminum structures, electromigration occurs primarily along the boundaries between grains of aluminum and causes atoms to shift from one grain to another, thereby causing voids in some areas and a building up of metal in other areas. The building up of metal is generally referred to as hillock formation. It is known that the addition of small amounts of copper to the aluminum contact metal reduces the electromigration phenomenon, and that the reduction in electromigration is proportional to the amount of copper added.

Through extensive experimentation, it has been discovered that the amount of electromigration that occurs is determined not only by the amount of copper employed, but also by the way in which the copper is dispersed within the aluminum metal layer. It has been found that when the metal layer is rapidly cooled following heat treatment, a fine grain structure of copper rich precipitate is formed throughout the aluminum layer. Slow cooling provides relatively large grains of copper rich precipitate. It has also been found that metal layers having a fine grain structure of copper rich precipitate therein are significantly more resistant to electromigration than layers having coarse grains of copper rich precipitate therein. It is believed that the small grains of copper rich precipitate form in the grain boundaries between grains of aluminum and at the junction of three or more aluminum grains, known as triple points. The grains of copper rich precipitate tend to prevent the motion of aluminum atoms along the grain boundaries. Photographs taken by means of an electron microscope appear to bear out these theories. The electron microscope photographs show that small grains of copper rich precipitate within an aluminum layer of metal do not move during electromigration producing conditions, whereas large grains on the surface and in the interior migrate.

Experimentation has shown that the electromigration along the surface of the metal layer 18 is further reduced by depositing the glass layer 20 over the metal layer 18. The glass layer 20 tends to capture the large grains of copper rich precipitate 26, which normally migrate, thereby reducing surface migration and further extending the life of the semiconductor.

The process of the present invention can be readily implemented into present semiconductor manufacturing processes. For example, the heat treating process can be implemented during the die bonding stage of semiconductor manufacture. During the die bonding process, the device is heated to a sufficient temperature to allow a proper bond between the device and its package. Typical temperatures encountered in the die bonding process are approximately 360°C. By raising the die bonding temperatures to 400°C, and preferably 425° to 475°C, the heat treatment according to the invention can be accomplished during die bonding. Generally exposing a device to a temperature in excess of 400°C for a period of approximately 5 seconds is sufficient to bring the copper into solution with the aluminum. When the device is removed from the die bonder, due to the extremely small mass of the device, the ambient air cools the device to room temperature in a period of 1 to 2 seconds which is sufficiently fast to cause small grains of the copper rich precipitate to form at the aluminum grain boundaries.

In summary, the techniques of the instant invention provide a way to achieve superior electromigration characteristics in a semiconductor contact than could be heretofore achieved. The techniques of the instant invention have the further advantage that they are fully compatible with existing production processes. Finally, the addition of the copper to the aluminum alloy reduces the formation of hillocks, thereby providing a contact having uniform resistance, and due to the increased hardness of the copper-aluminum alloy over a pure aluminum contact, a wire bond is more readily made to the alloy than to a pure aluminum contact with less deformation of the contact during bonding.

We claim:

1. A semiconductor device including in combination, a layer of semiconductor material, an area of impurities extending into said layer, an insulating layer formed on a surface of said device having an opening therein exposing a portion of said area, a metal layer making an ohmic contact to said area deposited on said area and over a predetermined portion of said insulating layer, said metal layer comprising aluminum and at least a 1% portion of copper for reducing electromigration within said metal layer and for increasing the strength thereof, said copper throughout said layer being in the form of copper rich grains generally having a diameter no greater than approximately 1,000 Angstroms.

2. A semiconductor device as recited in claim 1 wherein said copper rich grains include $CuAl_2$.

3. A semiconductor device as recited in claim 2 wherein said copper rich grains are interspersed between aluminum grains along the grain boundaries and triple points thereof.

4. A semiconductor device as recited in claim 1 further including a second insulating layer formed on the surface of said device over said metal layer for reducing electromigration along the surface of said metal layer.

* * * * *